United States Patent [19]
Romero et al.

[11] Patent Number: 5,544,412
[45] Date of Patent: Aug. 13, 1996

[54] METHOD FOR COUPLING A POWER LEAD TO A BOND PAD IN AN ELECTRONIC MODULE

[75] Inventors: Guillermo L. Romero; Joe L. Martinez, Jr., both of Phoenix, Ariz.

[73] Assignee: Motorola, Inc., Schaumburg, Ill.

[21] Appl. No.: 247,944

[22] Filed: May 24, 1994

[51] Int. Cl.⁶ ........................................ H05K 3/30
[52] U.S. Cl. .................. 29/832; 29/843; 29/880; 228/180.21; 361/767
[58] Field of Search ................ 29/832, 835, 836, 29/840, 842, 843, 760, 740, 850, 880, 831, 25.01; 228/180.1, 180.21, 180.22; 361/767; 174/52 FP

[56] References Cited

U.S. PATENT DOCUMENTS

| | | | |
|---|---|---|---|
| 3,855,693 | 12/1974 | Umbaugh | 228/180.21 X |
| 4,629,278 | 12/1986 | Norton et al. | 29/842 X |
| 4,675,989 | 6/1987 | Galloway et al. | 29/832 X |
| 5,272,596 | 12/1993 | Honore et al. | 29/850 X |
| 5,363,552 | 11/1994 | Coniff | 29/840 |
| 5,398,863 | 3/1995 | Grube et al. | 228/180.21 X |

FOREIGN PATENT DOCUMENTS 2268628  1/1994  United Kingdom ............... 29/840

*Primary Examiner*—Peter Vo
*Assistant Examiner*—Khan V. Nguyen
*Attorney, Agent, or Firm*—Rennie William Dover

[57] ABSTRACT

An electronic module and a method for coupling a power lead (32) to a bond pad (28) on a semiconductor die (17) within the electronic module. A clip support (13) having a slot (27) is coupled to a baseplate (11) via an isolation structure (14). The semiconductor die (17) is coupled to the baseplate (11) via an isolation structure (19). The power lead (32) is coupled to the isolation structure (14). The clip support (13) is coupled to the semiconductor die (17) via a clip (29), wherein a first end of the clip (29) is inserted in the slot (27) and a second end of the clip (29) is compressively mated with the semiconductor die (17). Compressively mating the clip (29) with the semiconductor die (17) eliminates the need for bond feet, thereby increasing the reliability of the module.

20 Claims, 2 Drawing Sheets

METHOD FOR COUPLING A POWER LEAD TO A BOND PAD IN AN ELECTRONIC MODULE

The present application is related to U.S. Pat. No. 5,371,043, entitled "METHOD FOR FORMING A POWER CIRCUIT PACKAGE," issued to Samuel J. Anderson et al. on Dec. 6, 1994 and assigned to the same assignee, Motorola, Inc.

The present application is further related to co-pending U.S. patent application Ser. No. 08/176,598, Attorney's Docket No. SC08507T, entitled "POWER DISSIPATION APPARATUS AND METHOD FOR MAKING", filed Jan. 3, 1994, abandoned, by Guillermo L. Romero et al. and assigned to the same assignee, Motorola, Inc.

The present application is further related to co-pending U.S. patent application Ser. No. 08/190,974, Attorney's Docket No. SC08508T, entitled "ELECTRONIC DEVICE ASSEMBLY AND METHOD FOR MAKING", filed Feb. 3, 1994, now U.S. Pat. No. 5,480,727, by Guillermo L. Romero et al. and assigned to the same assignee, Motorola, Inc.

The present application is further related to U.S. Pat. No. 5,465,481, entitled "METHOD FOR FABRICATING A SEMICONDUCTOR PACKAGE", issued to Guillermo L. Romero et al. on Nov. 14, 1995 and assigned to the same assignee, Motorola, Inc.

The present application is further related to co-pending U.S. patent application Ser. No. 08/235,992, Attorney's Docket No. SC08651T, entitled "ELECTRONIC MODULE FOR REMOVING HEAT FROM A SEMICONDUCTOR DIE AND METHOD OF MAKING", filed May 2, 1994, by Guillermo L. Romero et al. and assigned to the same assignee, Motorola, Inc.

BACKGROUND OF THE INVENTION

This invention relates, in general, to a semiconductor device package, and more particularly, to an electronic module and a method for coupling a power lead to a bond pad in the electronic module.

Power semiconductor devices are used in a variety of applications, including: electric vehicles, switch mode power supplies, and electric motors such as those used in cooling, heating, and ventilation systems. Since large currents flow through power semiconductor devices, they are generally packaged in modules capable of dissipating large amounts of heat. One type of power semiconductor device module includes a copper baseplate to which an isolation pad is mounted. The isolation pad may include a ceramic layer sandwiched between two thin copper sheets. One of the thin copper sheets is bonded to the copper baseplate which in turn is mounted to a cold plate or a heat sink. Semiconductor die are mounted to the second thin copper sheet.

Bonding pads on the semiconductor die are coupled to power leads by wire bonds. Subsequently, the semiconductor die, the wire bonds, and portions of the power leads are encapsulated by a molding compound. An important feature of this type of packaging scheme is that the wire bonds coupling the die bonding pads to the power leads have a large area to support the high current levels from the power semiconductor devices. Typically, the wire bonds are smaller than the bonding pads and are attached to the die bonding pads using ultrasound.

A major failure mechanism in these types of packaging schemes is that the bond foot, i.e., the location where the wire is connected to the die, may become fatigued and crack. Further, heavy buss bars to which the power modules are mounted can create a large twisting moment on the power leads, thereby creating stresses that may be transferred to the bond foot. Due to the encapsulation and the expansion of the encapsulation material during thermal cycling, wire bonds are pulled and stresses are induced on the wire bonds, thereby increasing the number of failures.

Accordingly, it would be advantageous to have an electronic module and a method for coupling a power lead to a bond pad in the electronic module that increases the reliability of the module. It would be of further advantage for the method to eliminate bond foot fatigue.

DETAILED DESCRIPTION OF THE DRAWINGS

Generally, the present invention provides an electronic module and a method for coupling a power lead to a bond pad within the electronic module. The electronic module includes a base structure having a clip support coupled to one portion of a top surface of the base structure by an isolation structure. In accordance with one embodiment of the present invention, the clip support has a notch or slot extending from one side of the clip support into the clip support. In addition, a power semiconductor die, having a bond pad disposed thereon, is coupled to another portion of the top surface of the base structure. A first end of a clip is inserted in the notch and a second end of the clip is compressively forced against the bond pad, thereby coupling the clip support to the bond pad. In other words, the clip cooperates with the clip support to force the second end of the clip towards the bond pad. Since the clip is mated with the bond pad via a compressive force, the use of wire bonds, i.e., bond feet, is eliminated, resulting in an electronic module having a higher reliability. It should be understood that bond pads are also referred to as bonding pads.

Figure 1:
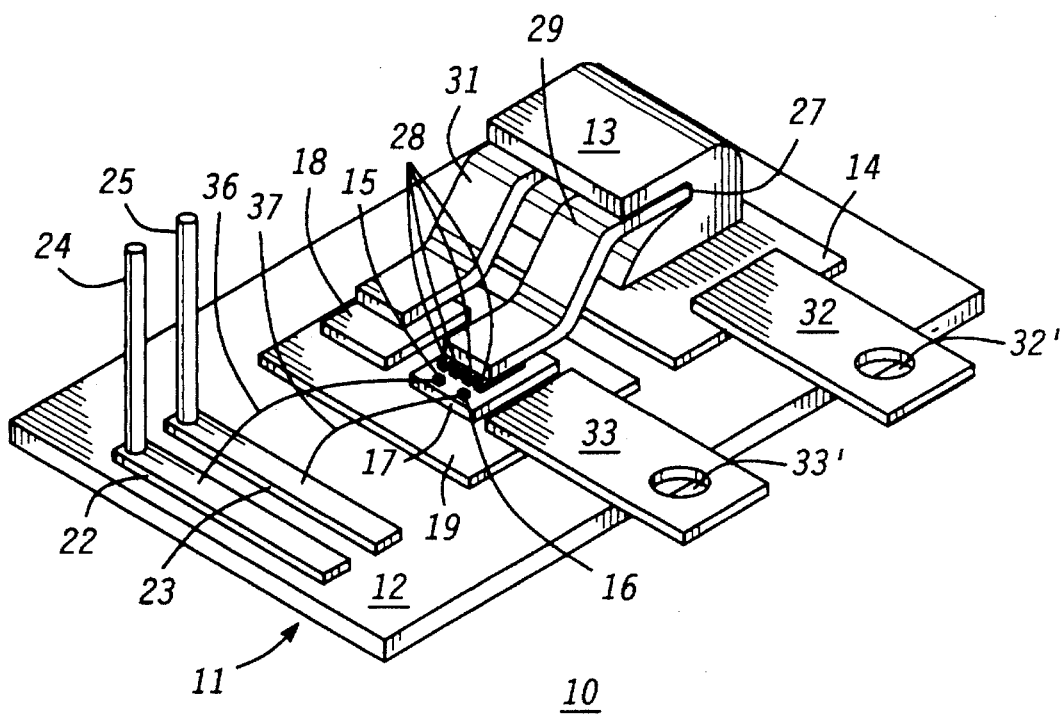
FIG. 1 illustrates an isometric view of a portion of an electronic module in accordance with a first embodiment of the present invention.

FIG. 1 illustrates an isometric view of a portion 10 of an electronic module in accordance with a first embodiment of the present invention. Preferably, portion 10 of the electronic module includes a rectangularly shaped baseplate 11 having a top surface 12. A clip support 13 is coupled to top surface 12 via an isolation structure 14. Similarly, a semiconductor die 17 and a semiconductor die 18 are coupled to top surface 12 by an isolation structure 19. By way of example, semiconductor die 17 is an insulated gate bipolar transistor (IGBT) and semiconductor die 18 is a diode. In addition, a plurality of isolation strips 22 and 23 are mounted to top surface 12. Isolation strip 22 serves as an interconnect strip for coupling a gate bonding pad 15 of IGBT 17 to a gate lead 24. Isolation strip 23 serves as an interconnect strip for coupling a sense bonding pad 16 of IGBT 17 to a sense lead 25. Although two semiconductor die are shown as being coupled to top surface 12, it should be understood that the number and type of semiconductor die coupled to top surface 12 are not limitations of the present invention. In other words, there may be more or less than two semiconductor die coupled to major surface 12 as well as more or less than two isolation strips mounted to top surface 12.

In one embodiment, baseplate 11 and clip support 13 are formed from porous silicon carbide preform structures which are formed from a slurry and molded into desired shapes using conventional injection molding technology. Although baseplate 11 is shown as having a rectangular shape, it should be understood that the shape and dimensions of baseplate 11 are not limitations of the present invention. Clip support 13 is shaped to have a notch 27. Although a portion of notch 27 is tapered, the shape of notch 27 is not a limitation of the present invention. The slurry may comprise a mixture of a powdered semiconductor material such as silicon carbide and a binding agent such as a polymer based xylene. Subsequently, the binding agent is burned away in an oven, leaving the porous silicon carbide preform structures.

By way of example, isolation structures 14 and 19 and isolation strips 22 and 23 are formed from a dielectric material which electrically isolates baseplate 11 from components such as, for example, clip support 13 and semiconductor die 17 and 18. It should be noted that clip support 13 and semiconductor die 17 and 18 are mounted to isolation structures 14 and 19, respectively. Suitable materials for the layer of dielectric material include aluminum nitride and aluminum oxide. Isolation structures 14 and 19 and isolation strips 22 and 23 are placed on baseplate 11 such that they are spaced apart from each other. Clip support 13 is placed on isolation structure 14. Baseplate 11 and clip support 13 are impregnated or infiltrated with a conductive material such as, for example, molten aluminum. Other suitable conductive materials include copper, alloys of aluminum, and alloys of copper. The molten aluminum fills the porous silicon carbide preform structures through continuous capillary liquid flow. Although isolation structures 14 and 19 and isolation strips 22 and 23 remain impervious to the molten aluminum, they become bonded to baseplate 11 and clip support 13. Further, the top surfaces of isolation structures 14 and 19 and isolation strips 22 and 23 are coated with a layer of aluminum. Methods of forming porous silicon carbide preform structures, infiltrating the porous silicon carbide preform structures with a conductive material, and bonding isolation structures and strips to the preform structures are described in U.S. Pat. No. 5,371,043, entitled "METHOD FOR FORMING A POWER CIRCUIT PACKAGE," issued to Samuel J. Anderson et al. on Dec. 6, 1994 and assigned to the same assignee, Motorola, Inc., and which is hereby incorporated herein by reference.

Using techniques well known to those skilled in the art, IGBT 17 and diode 18 are attached to the layer of aluminum coating isolation structure 19. A first end of a clip 29 is inserted into notch 27 and a second end of clip 29 is mated with source bonding pads 28. Conductors 29 and 31 and techniques for mating clips 29 and 31 with source bonding pads 28 and diode 18, respectively, are further described with reference to FIG. 2. Gate bonding pad 15 is coupled to gate lead 24 via isolation strip 22 and a lead 36. More particularly, lead 36 couples isolation strip 22 to gate bonding pad 15. Sense bonding pad 16 is coupled to sense lead 25 via isolation strip 23 and a lead 37. In particular, lead 37 couples isolation strip 23 to sense bonding pad 16. It should be understood that since the current flowing though leads 36 and 37 is much less than the current flowing through clips 29 and 31, they are smaller than clips 29 and 31. A power lead 32 is bonded to isolation structure 14, a power lead 33 is bonded to isolation structure 19, a gate lead 24 is bonded to isolation strip 22 and a sense lead 25 is bonded to isolation strip 23. Techniques for bonding clips to isolation structures and isolation strips as well as techniques for bonding leads to bonding pads and isolation strips are well known to those skilled in the art. Power leads 32 and 33 have mounting holes 32' and 33', respectively, for coupling the electronic module to motors, power supplies, buss bars, etc. It should be noted that the motors, power supplies, buss bars, etc. are not shown in the figures.

Although not shown, it should be understood that preferably, baseplate 11, clip support 13, isolation structures 14 and 19, isolation strips 22 and 23, semiconductor die 17 and 18, clips 29 and 31, and portions of leads 24, 25, 32, and 33 are encapsulated by an encapsulating material. Techniques for encapsulating components are well known to those skilled in the art. The encapsulating material protects the semiconductor die from being damaged by mechanical stresses, environmental contaminants, ionic contaminants, and moisture.

Figure 2:
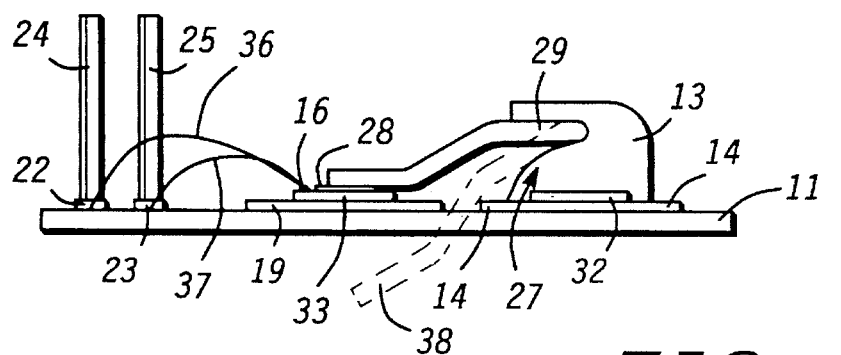
FIG. 2 illustrates a side view of the portion of the electronic module of FIG, 1.

FIG. 2 illustrates a side view of portion 10 of the electronic module of FIG. 1. It should be understood that the same reference numerals are used in the figures to denote the same elements. What is shown in FIG. 2 is baseplate 11 having isolation structures 14 and 19 mounted thereon. Clip support 13 is mounted to isolation structure 14 and IGBT 17 is mounted to isolation structure 19. In addition, FIG. 2 shows leads 24 and 25 coupled to baseplate 11 via isolation strips 22 and 23, respectively. Power leads 32 and 33 are shown as being mounted to isolation structures 14 and 19, respectively. More particularly, FIG. 2 shows clip support 13 coupled to IGBT 17 by clip 29. Preferably, clip 29 (and clip 31 shown in FIG. 1) is a flexible, sigmoidal shaped clip having a first end and a second end. Suitable materials for clips 29 and 31 include copper, alloys of copper, copper beryllium, gold, silver, aluminum, alloys of aluminum, brass, alloys of brass, and the like.

The first ends of clips 29 and 31 are inserted into slot 27. Although clip 31 is not shown in FIG. 2, it should be understood that the technique for inserting clip 31 into slot 27 and mating clip 31 with semiconductor die 18 are preferably the same as those used to insert clip 29 into slot 27 and mating clip 29 to semiconductor die 17. While inserting the first ends of clips 29 and 31 into slot 27, the second ends are flexed upward to prevent them from contacting the respective semiconductor die 17 and 18. In other words, clips 29 and 31 are flexed from a relaxed state to a compressed state by applying a force to the second ends of clips 29 and 31. After the first ends of clips 29 and 31 have been inserted into slot 27, the second ends of clips 29 and 31 are released and mate with or contact the respective semiconductor die 17 and 18. Clips 29 and 31 are prevented from returning to a relaxed state by semiconductor die 17 and 18. Thus, the second end of clip 29 exerts a compressive force on bonding pads 28, thereby electrically connecting clip support 13 with IGBT 17. Likewise, the second end of clip 31 exerts a compressive force on semiconductor die 18, thereby electrically connecting clip support 13 to semiconductor die 18 (FIG. 1). Dashed line 38 illustrates the position of clips 29 and 31 in a relaxed state. Optionally, the first ends of clips 29 and 31 are bonded to clip support 13 after insertion into slot 27 and the second ends of clips 29 and 31 are bonded to the respective bonding pads 28 and semiconductor die 18 (FIG. 1).

It should be understood that the maximum compressive force that a semiconductor die can withstand is determined by the area of the bonding pad. Conventional source bonding pads have dimensions less than 1,270 μm (50 mils) in width and a length of approximately 2,160 μm (85 mils). In accordance with the present invention, the source bond pads are larger than conventional bonding pads so a sufficient compressive force is exerted on the source bonding pads without damaging IGBT 17. By way of example, IGBT 17 has an area of approximately 9,779 square microns (μm$^2$), i.e., 385 square mils, wherein source bonding pads have a width of at least 1,270 μm (50 mils) and a length of at least 5,080 μm (200 mils). By way of example, IGBT 17 has 4 emitter bonding pads 28, each having a width of approximately 1,524 μm (60 mils) and a length of approximately 7,620 μm (300 mils).

Figure 3:
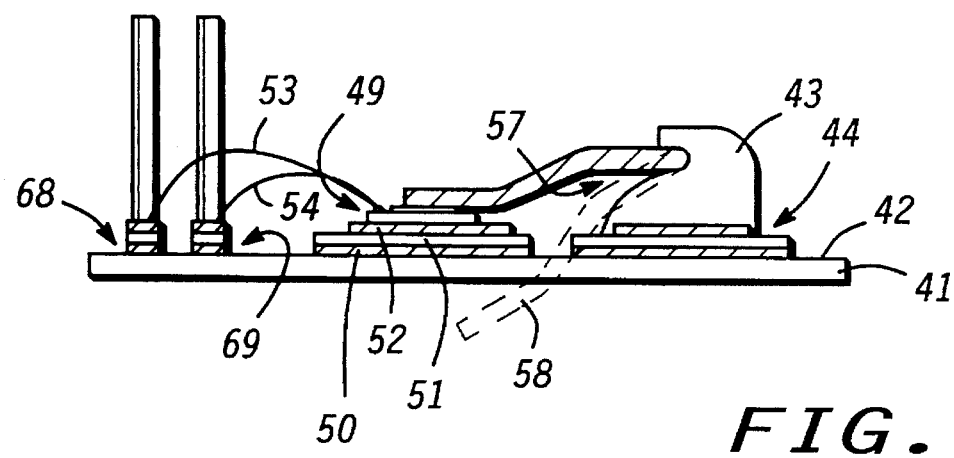
FIG. 3 illustrates a cross-sectional view of a portion of an electronic module in accordance with a second embodiment of the present invention.

FIG. 3 illustrates a cross-sectional view of a portion 40 of an electronic module in accordance with a second embodiment of the present invention. What is shown in FIG. 3 is a baseplate 41 having a top surface 42. Isolation structures 44 and 49 are mounted to top surface 42. A clip support 43 is mounted to isolation structure 44 and an IGBT 47 is mounted to isolation structure 49. Preferably, baseplate 41 and clip support 43 are preform structures formed by infiltrating a conductive material such as, for example, aluminum into a porous silicon carbide structure.

Isolation structures 44 and 49 and isolation strips 68 and 69 are formed by bonding a first layer of conductive material 50 to one side of a sheet of dielectric material 51 and bonding a second layer of conductive material 52 to an opposing side of the layer of dielectric material 51. In other words, sheet of dielectric material 51 is sandwiched between layers of conductive material 50 and 52. By way of example, layers of conductive material 50 and 52 are copper. Techniques for bonding copper to a layer of dielectric material are well known to those skilled in the art and may include, for example, a direct bonded copper technique.

In addition, FIG. 3 shows clip support 43 coupled to IGBT 47 by clip 59. FIG. 3 also shows a lead 46 coupled to a gate bonding pad (not shown) on IGBT 47 via a lead 53 and an isolation strip 68. Further, a lead 45 is coupled to IGBT 49 via a lead 54 and isolation strip 69. Preferably, clip 59 is a flexible, sigmoidal shaped clip having a first end and a second end. Suitable materials for clip 59 include copper, alloys of copper, copper beryllium, gold, silver, aluminum, alloys of aluminum, brass, alloys of brass, and the like. Although not shown, it should be understood that a semiconductor die analogous to semiconductor die 18 and power leads analogous to power leads 32 and 33 (FIG. 1) may be present.

The first end of clip 59 is inserted into a slot 57. While inserting the first end into slot 57, the second end is flexed upward to prevent it from contacting IGBT 47. In other words, clip 59 is flexed from a relaxed state to a compressed state by applying a force to the second end in a direction opposite baseplate 41. After the first end of clip 59 has been inserted into slot 57, the second end is released and mates with the source bonding pads (not shown) on IGBT 47. Conductor 59 is prevented from returning to a relaxed state by IGBT 47. Thus, the second end of clip 29 exerts a compressive force on the source bonding pads (not shown) on IGBT 47, thereby electrically connecting clip support 43 with IGBT 47. Dashed line 58 illustrates the position of clip 59 in a relaxed position. Optionally, the first end is bonded to clip support 43 after insertion into slot 57 and the second end is bonded to IGBT 47.

Although not shown in FIGS. 1–3, it should be understood that baseplate the baseplates, isolation structures, isolation strips, clips, and portions of the leads are encapsulated in a mold compound. The mold compound protects the semiconductor die from being damaged by mechanical stresses. Methods of encapsulating semiconductor die within a mold compound are well known to those skilled in the art.

Figure 4:
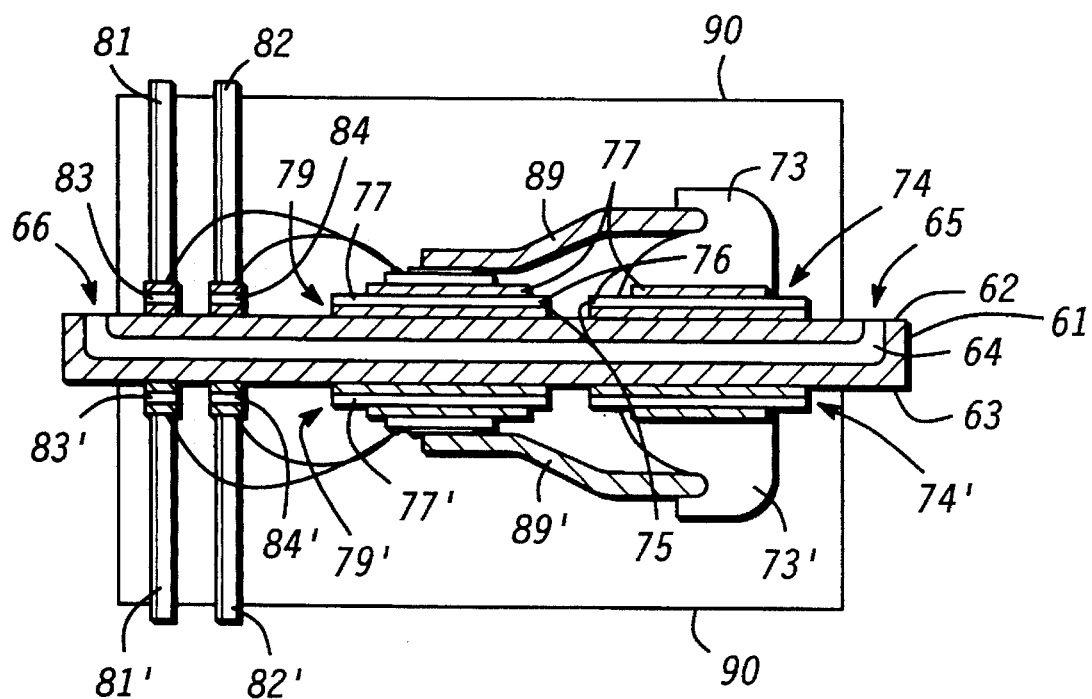
FIG. 4 illustrates a cross-sectional view of an electronic module in accordance with a third embodiment of the present invention.

FIG. 4 illustrates a cross-sectional view of an electronic module 60 in accordance with a third embodiment of the present invention. Electronic module 60 includes a rectangularly shaped unitary baseplate 61 having a top surface 62 and a bottom surface 63. Top surface 62 and bottom surface 63 are spaced apart by a cavity 64. Although not shown, top and bottom surfaces 62 and 63, respectively, may be coupled by internal heat fins. Further, unitary baseplate 61 has an inlet port 65 and an outlet port 66. Although ports 65 and 66 have been labeled inlet and outlet ports, respectively, it should be understood that, typically, unitary baseplate 61 is a symmetric structure, thus the inlet and outlet ports may be reversed. In operation, a cooling fluid flows into inlet port 65 and out of outlet port 66, transporting heat away from unitary baseplate 61 and any semiconductor die mounted to unitary baseplate 61.

In one embodiment, baseplate 61 is formed from silicon carbide preforms, wherein porous base and lid preforms (not shown) are formed from a slurry and molded into desired shapes using a conventional injection molding technology. The slurry may comprise a mixture of a powdered semiconductor material such as silicon carbide and a binding agent such as a polymer based xylene. Subsequently, the binding agent is burned away in an oven, leaving porous base and lid preform structures. The porous base preform is mated with the porous lid preform and placed in a bath of molten aluminum at atmospheric pressure. The molten aluminum infiltrates the mated preforms. Although the porous base and porous lid are individual preform components prior to infiltration, the molten aluminum flows continuously within both preforms through capillary flow and unites the two parts into a unitary, sealed, reinforced baseplate with a hollow inside that may have fins. In addition to forming a unitary baseplate 61, the molten aluminum serves to strengthen baseplate 61. Likewise, clip supports 73 and 73' are preform structures formed by infiltrating a conductive material such as, for example, aluminum into a porous silicon carbide structures. It should be noted that in FIG. 4, primes (') have been added to the reference numerals solely to distinguish the components mounted to top surface 62 from the components mounted to bottom surface 63. In other words, the components bonded to top surface 62 are the same as the components bonded to the bottom surface 63, but primes have been added to point out that electronic module is a dual-sided structure.

Isolation structures 74 and 79 are formed by bonding a first layer of conductive material 75 to one side of a sheet of dielectric material 76 and bonding a second layer of conductive material 77 to an opposing side of the layer of dielectric material 76. In other words, sheet of dielectric material 76 is sandwiched between layers of conductive material 75 and 77. By way of example, layers of conductive material 75 and 77 are copper. Techniques for bonding copper to a ceramic substrate are well known to those skilled in the art and may include, for example, a direct bonded copper technique. FIG. 4 also shows leads 81 and 82 coupled to baseplate 61 via isolation strips 83 and 84, respectively.

In addition, FIG. 4 shows support 73 coupled to IGBT 77 by clip 89. Preferably, clip 89 is a flexible, sigmoidal shaped clip having a first end and a second end. Although not shown, it should be understood that a semiconductor die analogous to semiconductor die 18 and power leads analogous to power leads 32 and 33 of FIG. 1 may be present.

Isolation structures 74' and 79' are formed by bonding a first layer of conductive material 75' to one side of a sheet of dielectric material 76' and bonding a second layer of conductive material 77' to an opposing side of the sheet of dielectric material 76'. In other words, sheet of dielectric material 76' is sandwiched between layers of conductive material 75' and 77'. By way of example, layers of Conductive material 76' and 77' are copper. FIG. 4 also shows leads 81' and 82' coupled to baseplate 61' via isolation strips 83' and 84', respectively. In addition, FIG. 4 shows clip 89' coupling clip support 73' to IGBT 77'. Preferably, clip 89' is a flexible, sigmoidal shaped clip having a first end and a second end.

FIG. 4 further shows a portion of baseplate 61, clip supports 73 and 73', isolation structures 74, 74', 79, and 79', insolation strips 83, 83', 84 and 84', and clips 89 and 89' encapsulated by an encapsulating material or a mold compound 90. Techniques for encapsulating components and suitable types of mold compounds are well known to those skilled in the art. The mold compound protects the semiconductor die from being damaged by mechanical stresses, environmental contaminants, ionic contaminants, and moisture. Ports 65 and 66 are not encapsulated within mold compound 90.

By now it should be appreciated that an electronic module and a method for coupling a power lead to a bond pad within the electronic module has been provided. In accordance with the present invention, the electronic module includes a clip support coupled to a portion of a baseplate via an isolation structure. In addition, a semiconductor die is coupled to another portion of the baseplate via another isolation structure. Source bonding pads are coupled to the clip support via a clip, wherein one end of the clip is inserted in the clip support and another end of the clip is compressively mated with the source bonding pads, thereby eliminating bond feet and increasing the reliability of the electronic module. Other advantages include a reduction in current loop inductance by using a single planar clip rather than a plurality of cylindrical shaped clips; an increase in current carrying capability of the clip since the clip has a larger cross-sectional area; and an increase in the reliability of the module because of the elimination of wire bonds and the limitations associated with wire bonds.

While we have shown and described specific illustrative embodiments of the present invention, different embodiments, modifications and improvements will occur to those skilled in the art. We desire it to be understood, therefore, that this invention is not limited to the particular forms shown. We intend in the appended claims to cover all modifications that do not depart from the spirit and scope of this invention. For example, a single isolation structure may be coupled to the top surface of the baseplate, wherein conductive pads are bonded to the single isolation structure.

What is claimed is:

1. A method for coupling a power lead to a bond pad in an electronic module, comprising the steps of:

forming a baseplate having a top surface and a bottom surface;

mounting at least one isolation structure to the top surface, the at least one isolation structure having a first region electrically isolated from a second region;

mounting a first clip support to the first region of the at least one isolation structure, wherein the first clip support is coupled to the first portion of the top surface by the at least one isolation structure;

coupling the bond pad to the second region of the at least one isolation structure;

electrically coupling the power lead to the first clip support; and electrically coupling the first clip support to the bond pad with a clip, wherein the power lead becomes electrically coupled to the bond pad, and wherein the first clip support and the first and second regions of the at least one isolation structure are electrically conductive.

2. A method for coupling a power lead to a bond pad as claimed in claim 1, wherein the step of mounting at least one isolation structure to a portion of the top surface comprises the steps of:

mounting a first isolation structure to a first portion of the top surface; and mounting a second isolation structure to a second portion of the top surface; and wherein the step of mounting the first clip support to the first region of the at least one isolation structure includes mounting the first clip support to the first isolation structure, wherein the first clip support is coupled to the first portion of the top surface by the first isolation structure; and wherein the step of coupling the bond pad to the second region of the at least one isolation structure includes forming the bond pad on the second isolation structure.

3. A method for coupling a power lead to a bond pad as claimed in claim 2, wherein the step of coupling the bond pad to the second region of the isolation structure comprises mounting a semiconductor die to the second region of the at least one isolation structure, wherein the semiconductor die has the bond pad disposed thereon, and wherein the bond pad is coupled to the second region of the at least one isolation structure via the semiconductor die and the second isolation structure.

4. A method for coupling a power lead to a bond pad as claimed in claim 1, wherein the step of mounting the first clip support to the first region of the at least one isolation structure includes providing the first clip support wherein the first clip support has a notch and the step of electrically coupling the first clip support to the bond pad with a clip comprises the steps of:

providing the clip, wherein the clip is flexible, sigmoidally shaped and has first and second ends;

inserting the first end of the clip into the notch; and placing a portion of the second end of the clip in contact with the bond pad.

5. A method for coupling a power lead to a bond pad as claimed in claim 1, wherein the step of coupling the bond pad to the second region of the at least one isolation structure includes mounting a semiconductor die to the second region of the at least one isolation structure, the semiconductor die having the bond pad disposed thereon, wherein the bond pad is coupled to the top surface via the semiconductor die and the at least one isolation structure.

6. A method for coupling a power lead to a bond pad as claimed in claim 1, further including forming the baseplate as a porous preform and forming the first clip support as another porous preform, wherein the baseplate and the first clip support comprise silicon carbide.

7. A method for coupling a power lead to a bond pad as claimed in claim 1, wherein the step of mounting a first clip support to the first region of the at least one isolation structure, comprises the steps of:

placing the at least one isolation structure having first and second major surfaces in contact with the baseplate, the at least one isolation structure comprising a dielectric material and the first major surface in contact with the top surface of the baseplate;

placing the first clip support on a portion of the at least one isolation structure, wherein the first clip support is in contact with the second major surface of the dielectric material; and impregnating the baseplate and the first clip support with a molten metal, the molten metal bonding the at least one isolation structure to the baseplate and bonding the first clip support to the at least one isolation structure.

8. A method for coupling a power lead to a bond pad as claimed in claim 1, wherein the step of mounting a first clip support to the first region of the at least one isolation structure, comprises the steps of:

impregnating the baseplate and the first clip support with a molten metal;

bonding the at least one isolation structure to the baseplate which is impregnated with the molten metal, the at least one isolation structure comprising a layer of dielectric material sandwiched between first and second layers of conductive material, wherein the first layer of the conductive material contacts the first portion of the top surface of the baseplate which is impregnated with the molten metal; and bonding the first clip support which is impregnated with the molten metal to a portion of the second layer of conductive material, wherein the first clip support which is impregnated with the molten metal is coupled to the first portion of the top surface of the baseplate via the at least one isolation structure.

9. A method for coupling a power lead to a bond pad as claimed in claim 1, wherein the step of forming a baseplate further comprises forming the baseplate having a cavity between the top surface and the bottom surface and wherein the top surface includes a plurality of ports.

10. A method for coupling a power lead to a bond pad as claimed in claim 1, further comprising the steps of:

coupling a second clip support to a first portion of the bottom surface of the baseplate, wherein the second clip support is electrically conductive;

coupling another bond pad to a second portion of the bottom surface of the baseplate;

electrically coupling another power lead to the second clip support; and electrically coupling the second clip support to the another bond pad with another clip, wherein the another power lead becomes electrically coupled to the another bond pad.

11. A method for coupling a power lead to a bond pad in an electronic module, comprising the steps of:

forming a porous baseplate having a top surface and a bottom surface;

forming at least one porous clip support, the at least one porous clip support having a notch for mating with a clip;

covering a first portion of the top surface with a first layer of dielectric material;

placing the at least one clip support on a first portion of the first layer of dielectric material;

impregnating the porous baseplate and the porous clip support with a conductive material, wherein the step of impregnating bonds the porous baseplate and the porous clip support to the first layer of dielectric material;

coupling the bond pad to a second portion of the top surface;

electrically coupling the power lead to the porous first clip support that is impregnated with the conductive material; and compressively coupling the clip to the at least one porous clip support and bond pad, wherein the power lead becomes electrically coupled to the bond pad.

12. A method for coupling a power lead to a bond pad as claimed in claim 11, wherein the step of covering a first portion of the top surface with a first layer of dielectric material includes covering the second portion of the top surface with a second layer of dielectric material and the step of coupling the bond pad to a second portion of the top surface includes mounting a first semiconductor die to a first portion of the second layer of dielectric material, the first semiconductor die having the bond pad disposed thereon, and wherein the bond pad is coupled to the second portion of the top surface via the second layer of dielectric material.

13. A method for coupling a power lead to a bond pad as claimed in claim 12, wherein the step of mounting a first semiconductor die to the second layer of dielectric material includes mounting a second semiconductor die to a second portion of the second layer of dielectric material, wherein the first semiconductor die includes an insulated gate bipolar transistor having at least one bond pad and the second semiconductor die includes a diode.

14. A method for coupling a power lead to a bond pad as claimed in claim 13, wherein the at least one bond pad has a width of at least 1,270 microns and a length of at least 5,080 microns.

15. A method for coupling a power lead to a bond pad as claimed in claim 11, wherein the steps of forming a porous baseplate and forming at least one porous clip support include using silicon carbide to form the porous baseplate and the at least one porous clip support, and the step of impregnating includes impregnating with aluminum.

16. A method for coupling a power lead to a bond pad as claimed in claim 11, wherein the step of compressively coupling comprises inserting a first end of a clip in the notch of the at least one porous clip support that is impregnated with the conductive material and mating a second end of the clip with the bond pad.

17. A method for coupling a power lead to a bond pad as claimed in claim 16, wherein the step of compressively coupling includes pressing the second end of the clip against the bond pad wherein the second end of the clip applies a compressive force against the bond pad.

18. A method for coupling a power lead to a bond pad in an electronic module, comprising the steps of:

forming a baseplate having a top surface and a bottom surface;

mounting first and second isolation structures to first and second portions of the top surface, respectively;

mounting a first clip support to the first isolation structure, wherein the first clip support is coupled to a first portion of the top surface by the isolation structure;

coupling the bond pad to the second isolation structure;

electrically coupling the power lead to the first clip support; and electrically coupling the first clip support to the bond pad with a clip, wherein the power lead becomes electrically coupled to the bond pad.

19. A method for coupling a power lead to a bond pad as claimed in claim 18, wherein the step of mounting a first clip support to the first isolation structure, comprises the steps of:

placing the first isolation structure having first and second major surfaces in contact with the first portion of the top surface, the first isolation structure comprising a dielectric material and the first major surface in contact with the first portion of the top surface;

placing the second isolation structure having first and second major surfaces in contact with the second portion of the top surface, the second isolation structure comprising a dielectric material and the first major surface in contact with the second portion of the top surface;

placing the first clip support on a portion of the first isolation structure, wherein the first clip support is in contact with the second major surface of the dielectric material;

placing the bond pad over a portion of the second isolation structure; and impregnating the baseplate and the first clip support with a molten metal, the molten metal bonding the first and second isolation structures to the baseplate and bonding the first clip support to the first isolation structure.

20. A method for coupling a power lead to a bond pad as claimed in claim 18, wherein the step of coupling the bond pad to the second isolation structure includes mounting a semiconductor die to the second isolation structure, the semiconductor die having the bond pad disposed thereon, wherein the bond pad is coupled to the second portion of the top surface via the semiconductor die and the isolation structure.

* * * * *